United States Patent
Lee

(10) Patent No.: US 7,054,210 B2
(45) Date of Patent: May 30, 2006

(54) WRITE/PRECHARGE FLAG SIGNAL GENERATION CIRCUIT AND CIRCUIT FOR DRIVING BIT LINE ISOLATION CIRCUIT IN SENSE AMPLIFIER USING THE SAME

(75) Inventor: Chang Hyuk Lee, Icheon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 56 days.

(21) Appl. No.: 10/876,158

(22) Filed: Jun. 24, 2004

(65) Prior Publication Data
US 2005/0232032 A1    Oct. 20, 2005

(30) Foreign Application Priority Data
Apr. 20, 2004    (KR) .................... 10-2004-0027088

(51) Int. Cl.
*G11C 7/00*    (2006.01)
(52) U.S. Cl. ...................... 365/203; 365/191
(58) Field of Classification Search ................ 365/203, 365/191
See application file for complete search history.

(56) References Cited

U.S. PATENT DOCUMENTS

| 6,487,132 B1* | 11/2002 | Bae et al. .................... 365/203 |
| 6,618,319 B1* | 9/2003 | Ooishi et al. ............... 365/233 |
| 6,862,244 B1* | 3/2005 | Lee ........................ 365/230.03 |

* cited by examiner

*Primary Examiner*—Michael T. Tran
(74) *Attorney, Agent, or Firm*—Marshall, Gerstein & Borun LLP

(57) ABSTRACT

Provided is a bitline isolation circuit in a sense amplifier generating an isolation signal for controlling an isolation circuit to isolate a connection between a bitline sense amplifier and a bitline at the beginning of sensing of a read operation, according to an output of a control unit generating an isolation control signal, a start signal of the bitline sense amplifier, and a memory block select signal. The control unit includes: a write pulse generation unit for generating a first control signal, according to a first input signal as a bank address signal latched for every clock, a second input signal generated when a write or a read command is inputted, and a third input signal having a different level according to the read or the write command; and an isolation control signal generation unit for generating the isolation control signal, according to the first control signal and the second control signal having a different level according to a row active operation and a precharge operation.

19 Claims, 5 Drawing Sheets

US 7,054,210 B2

WRITE/PRECHARGE FLAG SIGNAL GENERATION CIRCUIT AND CIRCUIT FOR DRIVING BIT LINE ISOLATION CIRCUIT IN SENSE AMPLIFIER USING THE SAME

This application relies for priority upon Korean Patent Application No. 2004-0027088 filed on Apr. 20, 2004, the contents of which are herein incorporated by reference in their entirety.

BACKGROUND

1. Field of the Invention

The present invention relates to a write/precharge flag signal generation circuit of a semiconductor memory device and a circuit for driving a bitline isolation circuit in a sense amplifier using the same, and more particularly to, a circuit for driving a bitline isolation circuit, capable of efficiently isolating a connection between a bitline and the sense amplifier at the beginning of a read operation.

2. Discussion of Related Art

In general, data stored in a memory cell of a semiconductor memory device is amplified by a bitline sense amplifier. FIG. 6 is a circuit diagram illustrating a general bitline sense amplifier.

A sense amplifier 1 sensing data loaded in a pair of bitlines BL and /BL by sense amplifier control signals RTO and /S is comprised of first and second NMOS transistors NM1, NM2, and first and second PMOS transistors PM1, PM2, cross-coupled each other. A first isolation circuit 2 isolating or connecting between a pair of bitlines BL and /BL and the sense amplifier 1 by a bitline isolation signal BISH is comprised of third and fourth NMOS transistors NM3 and NM4. A second isolation circuit 3 isolating or connecting between the sense amplifier 1 and another bitline by a bitline isolation signal BISL is comprised of fifth and sixth NMOS transistors NM5 and NM6. A seventh NMOS transistor NM7 equalizes a pair of bitlines BL and /BL by a bitline equalization signal BLEQ. A precharge unit 4 is comprised of eighth and ninth NMOS transistors NM8 and NM9 precharging a pair of bitlines BL and /BL to a precharge voltage VBLP by the bitline equalization signal BLEQ. A connection unit 5 is comprised of tenth and eleventh NMOS transistors NM10 and NM11 alternatively transferring the data sensed by the sense amplifier 1 into input/output lines IO and /IO, according to a column control signal YI.

It will now be described about the operation of the general sense amplifier constructed as described above.

First of all, since a voltage of a word line in a standby state is a ground voltage and the bitline equalization signal BLEQ is a high level, a pair of bitlines BL and /BL have been precharged to an identical voltage VBLP, and the sense amplifier control signals RTO and /S have been all precharged to a precharge voltage VBLP.

Then, as the bitline equalization signal BLEQ becomes a low level, a pair of bitlines BL and /BL become a floating state isolated from the external, with maintaining the precharge voltage VBLP.

On the other hand, a row decoder selects one word line by decoding a row address inputted from the external and then rises its voltage. Accordingly, a charge of a cell connected to the selected word line is loaded on the corresponding bitline BL, and then rises or falls down the voltage of the bitline according to the data of the cell. During this, the sense amplifier 1 is activated and a voltage difference of a pair of bitlines BL and /BL is amplified by the sense amplifier control signals RTO and /S. When the voltage difference of a pair of bitlines BL and /BL are developed to a certain point, the sense amplifier 1 is disabled by the sense amplifier control signals RTO and /S and then the sensing operation is completed.

Here, the first isolation circuit 2 isolates a connection between a pair of bitlines and the sense amplifier in order to reduce load to be amplified by the sense amplifier at the beginning of sensing operation.

The first isolation circuit 2 is controlled by an isolation driving circuit shown in FIG. 1 and a control circuit shown in FIG. 2. It will be described about an operation of the isolation driving circuit with reference to FIGS. 1, 2 and 3 as follows.

At first, it will be described about the control circuit in FIG. 2.

A control signal write6 is initiated to a high level during a power up operation and then becomes a low level according to a read command, while becoming a high level according to a write command. A control signal wlst_bis becomes a high level during a row active operation, and then becomes a low level during a precharge operation.

During a read cycle in the row active operation, the control signal wlst_bis becomes a high level and the control signal write6 becomes a low level. As a result, an output bis_ctrl of a NAND gate G1 becomes a low level.

Referring to FIG. 1, a control signal sbe is a sensing start signal of the bitline sense amplifier. When the control signal sbe is in a high level, the sensing operation is started. Control signals bs_u, bs_d are block select signals and the signals are enabled in a low level.

As the output bis_ctrl of the control circuit in FIG. 2 is a low level, a NOR gate Nor1 inverts an inputted signal. When the control signal sbe is transited from a low level to a high level (starting sensing of the bitline sense amplifier), an output AA of a NAND gate nand1 becomes a low level so that an output of the NOR gate Nor1 becomes a high level. Accordingly, an output of a differential amplifier 10 becomes a low level so that an output node0 becomes a low level.

As soon as the output node0 becomes a low level, NAND gates nand2, nand4 output a high level regardless of the control signals bs_u and bs_d. Therefore, PMOS transistors P0 and P1 are turned off. In addition, as soon as the output node0 becomes a low level, NAND gates nand3 and nand5 output a high level regardless of the control signals bs_u and bs_d. Accordingly, outputs bsb_ud and bsb_dd becomes a high level. One of the control signals bs_u, bs_d becomes a low level in a row active state, so that an output of a NAND gate nand6 becomes high state. Therefore, PMOS transistors P2 and P3 are turned off. As a result, because the NMOS transistor n0 and n1 are turned on, the control signals BISH and BISL driving the first and second isolation circuits in FIG. 6 become a low level.

Then, when the output of the differential amplifier 10 is transited from a low level to a high level, that is, the output node0 is transited from a low level to a high level, the NAND gates nand2, nand3, nand4 and nand5 are all operated as an inverter. Assuming that the control signal bs_u is a low level and the control signal bs_d is a high level, as the PMOS transistor P0 is turned on and its output bis_ud is a high level, the NMOS transistor n1 is turned on but the PMOS transistor P1 and the NMOS transistor n0 are turned off. During this, the PMOS transistors P2 and P3 maintain a turn-off state. Therefore, the output BISH becomes VPP level, while the output BISL becomes a zero level.

The outputs BISH, BISL becomes inputs of the first and second isolation circuit of the bitline sense amplifier as shown in FIG. 6. There is a main characteristic operation of the conventional art to make the aforementioned output BISH with a low level at the beginning of sensing (the moment that a RTO of FIG. 6 moves to a high level and a /S of FIG. 6 moves to a low level) and then to make it with VPP level after a predetermined time.

Additionally, during a write cycle in the row active operation, the control signal write becomes a high level and then the output bis_ctrl of the control circuit becomes a high level. As a result, the output node0 becomes a high level. Accordingly, the outputs BISH, BISL don't become a low level at the beginning of sensing during the write operation. If the outputs BISH and BISL are off at the beginning of sensing during the write operation as during the read operation, in case that the off period and a period enabling the column select line YI of FIG. 6 are overlapped, the write operation is performed only in the sense amplifier 1 by transistors NM11 and NM12 in FIG. 6 but isn't performed in a memory cell connected to the bitline, during the column select line YI being enabled. As a result, the write operation of the memory cell is dependant on the sensing operation of the sense amplifier after closing the column select line YI, so that tWR (a time possible to get a precharge command after a write command) is being worse.

However, in the conventional art, if the read command is given after the row active as shown in FIG. 3, the timing that an output of the NAND gate nand1 is generated to a low level by transiting the control signal sbe to a high level may be later that the timing that the output bis_ctrl of the control circuit by the read command is transited to a low level. During this, an output of the NOR gate Nor1 is not generated to a high level, or if generated so, a pulse width is being narrower. That is, as shown in FIG. 3, the output node0 should maintain a low level width up to a section denoted with a dotted line but can have less row pulse width than that. In this case, it is disadvantageous not to maintain the BISH with a low level at the beginning of sensing for a predetermined time.

SUMMARY OF THE INVENTION

The present invention is directed to a bitline isolation driving circuit of a sense amplifier, capable of overcoming those disadvantages by operating an isolation circuit of a bitline sense amplifier according to a read/precharge flag.

One aspect of the present invention is to provide a bitline isolation driving circuit for generating an isolation signal to control an isolation circuit for isolating a connection between a bitline sense amplifier and a bitline at the beginning of sensing of a read operation, according to an output signal of a control unit generating an isolation control signal, a start signal of the bitline sense amplifier and a memory block select signal, comprising the control unit which includes: a write pulse generation unit for generating a first control signal according to a first input signal as a bank address signal latched for every clock inputting, a second input signal generated when a write or a read command is inputted, and a third input signal varying level according to the read or the write command; and an isolation control signal generation unit for generating the isolation control signal according to the first control signal, and a second control signal varying level according to a row active operation and a precharge operation.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Hereinafter, it will be described about a bitline isolation driving circuit in a sense amplifier according to the present invention with reference to the accompanying drawings as follows.

Figure 4:
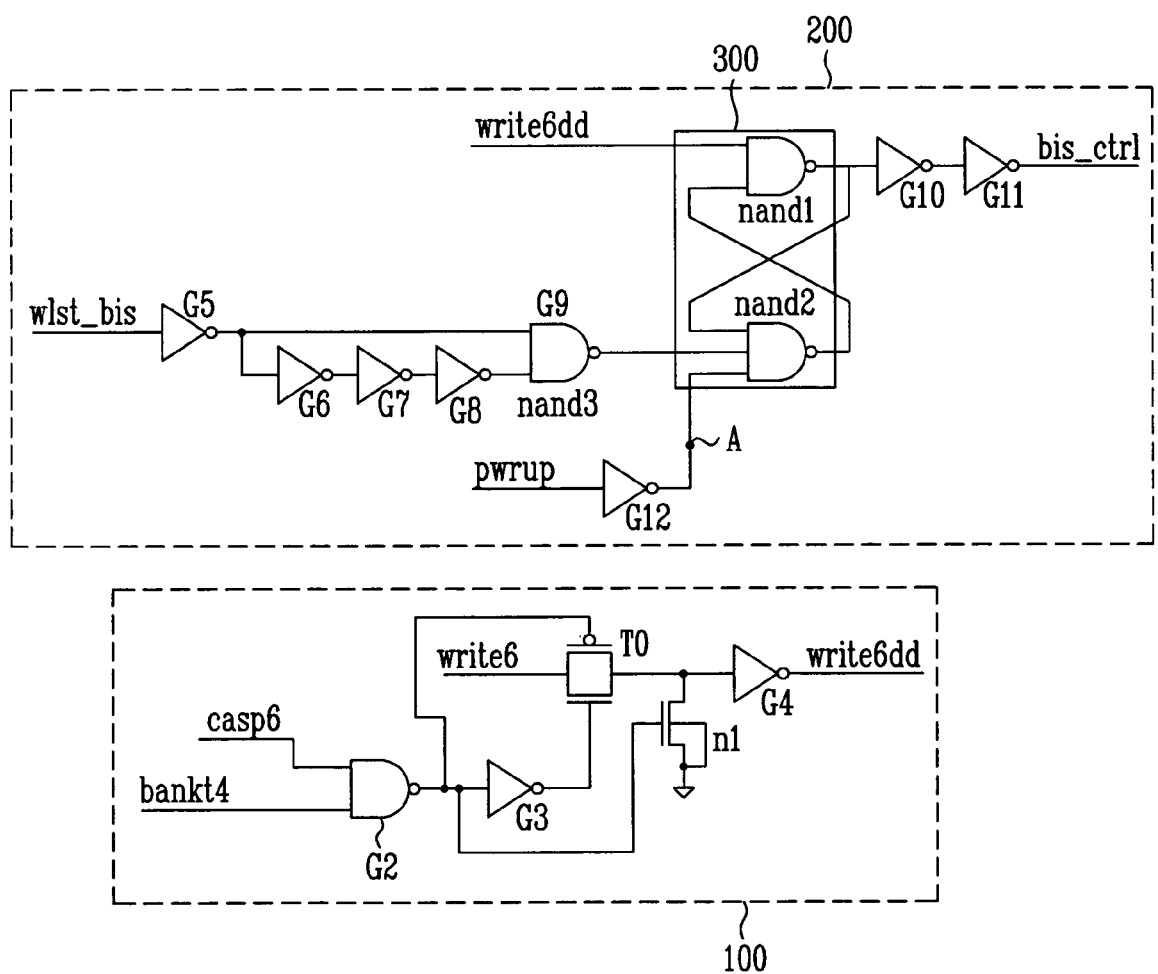
FIG. 4 is a circuit diagram illustrating a control circuit for controlling a bitline isolation driving circuit of a sense amplifier in accordance with the present invention.

FIG. 4 is a circuit diagram illustrating a control circuit for controlling a bitline isolation driving circuit of a sense amplifier in accordance with the present invention.

It will now be explained of an operation of the control circuit with reference to FIG. 5.

The bitline isolation driving circuit of the sense amplifier according to an embodiment of the present invention includes a write pulse generation unit 100 and an isolation control signal generation unit 200. The bitline isolation driving circuit exists one for every bank. The control circuit of FIG. 4, as a write/precharge flag circuit, has a write command and a precharge command as inputs, and then, becomes a first level (for instance, a high level) for the write command, while generates an output signal varied to a second level (a low level) different from the first level for the precharge command.

That is, the write/precharge flag circuit has a signal generated in response to the write command and another signal generated in response to the precharge command as inputs. As a result, the write/precharge flag circuit generates output signals having different states from each other according to which one of the two input signals is inputted more lately.

A control signal write6 is initiated to a high level during a power-up operation and then becomes a low level in response to a read command, while becoming a high level in response to the write command. A control signal wlst_bis becomes a high level during a row active operation, while becoming a low level during the precharge operation. The control signal write6 doesn't include a bank information, but the control signal wlst_bis includes it.

A power-up signal maintains in a high level when a supply voltage is less than a specific voltage, while maintaining a low level when the supply voltage is more than the specific voltage. A control signal bankt4 is a bank address signal (including the bank information) latched for every clock. A control signal casp6 is a high pulse signal generated when the write or the read command is inputted and it doesn't include the bank information.

Figure 1:
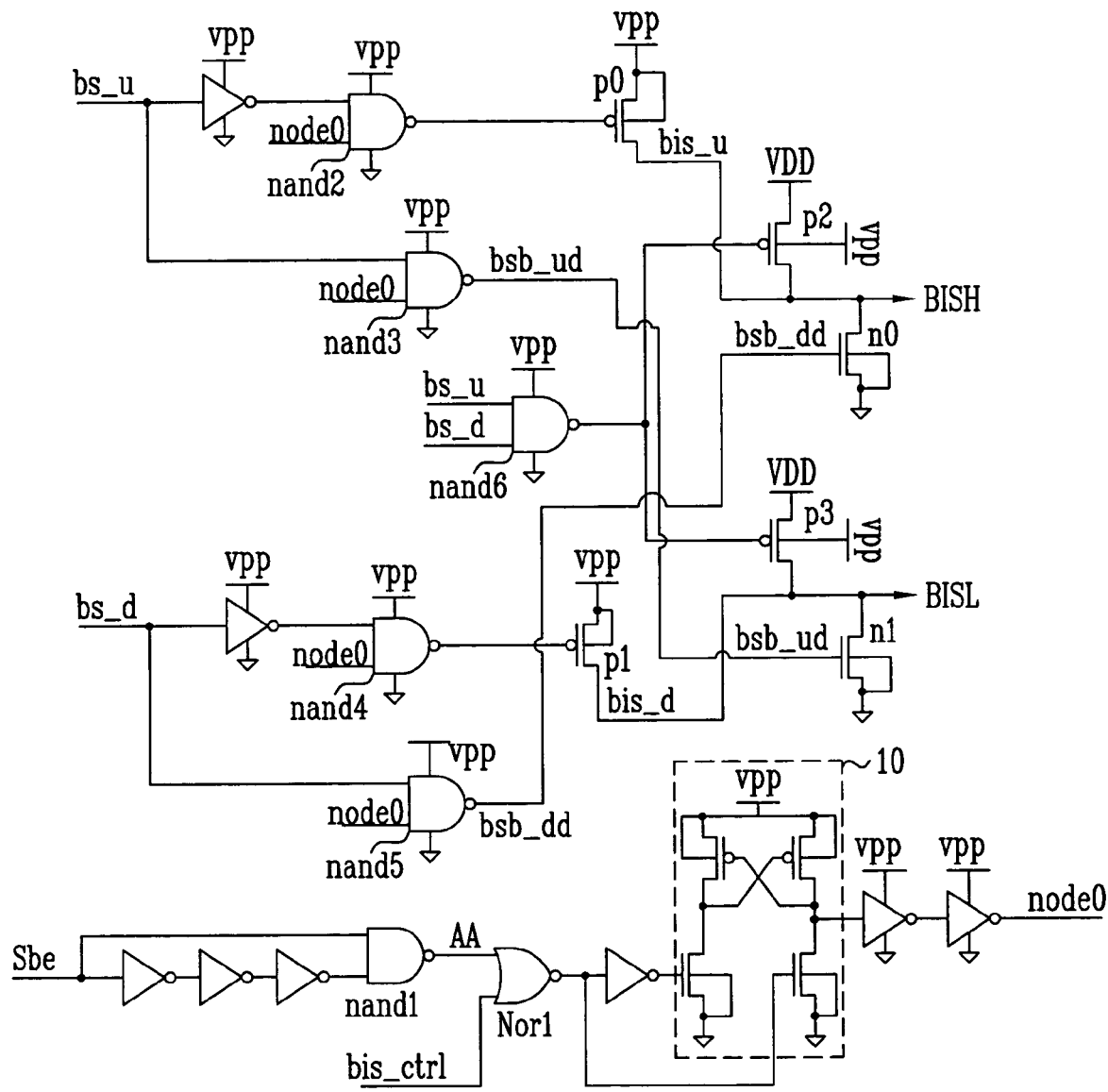
FIG. 1 is a circuit diagram illustrating a bitline isolation driving circuit in a sense amplifier of the conventional art.
Figure 2:
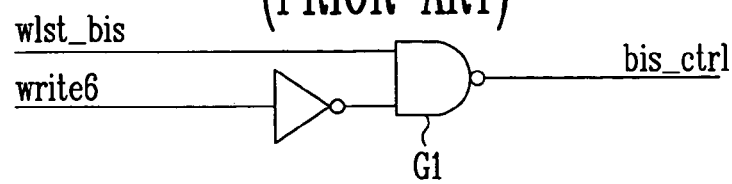
FIG. 2 is a circuit diagram illustrating a control circuit for controlling the circuit in FIG. 1.
Figure 3:
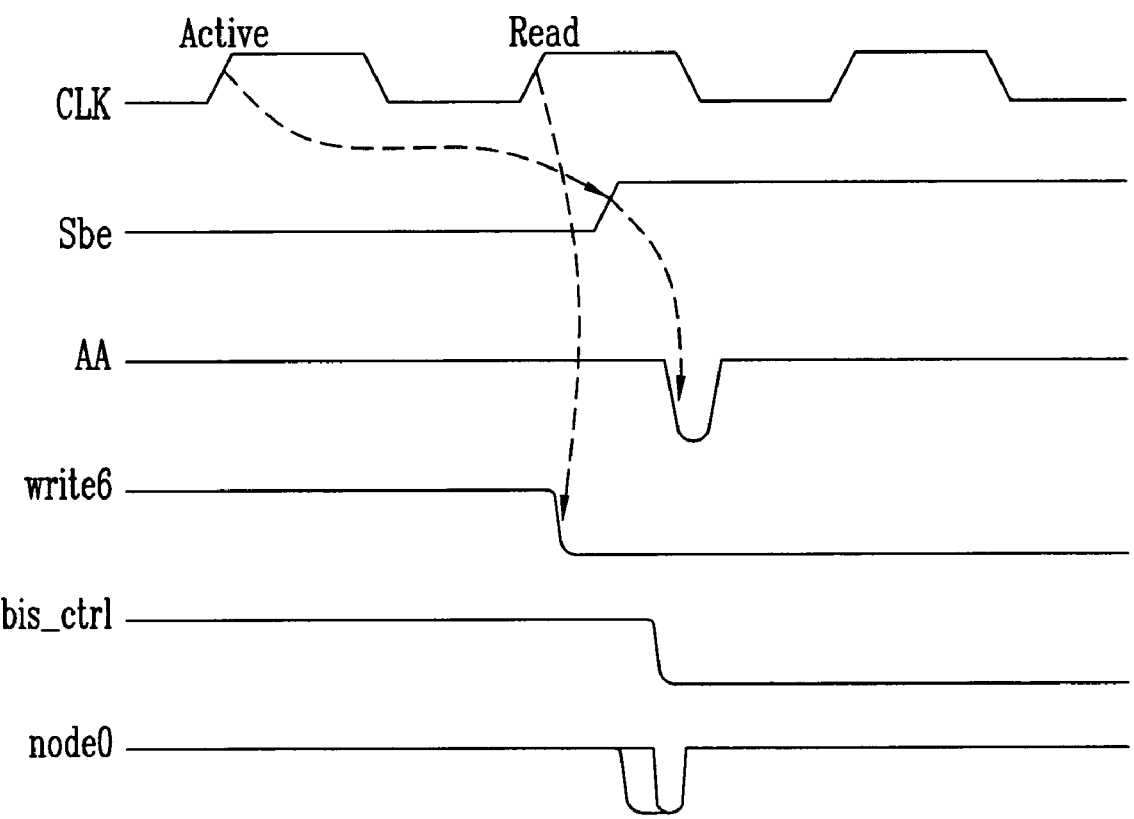
FIG. 3 is a waveform diagram illustrating operations of circuits in FIGS. 1 and 2.

When the power-up signal pwrup is a high level during the power-up operation, the control signals bankt4 and casp6 are a low level. As a result, the NMOS transistor n1 is turned on, which results in that an output write6dd of the write pulse generation unit 100 is initiated to a high level. Accordingly, an output of the NAND gate nand2 in the isolation control signal generation circuit 200 is initiated to a high level, and an output of the NAND gate nand1 is initiated to a low level. During this, the output bis_ctrl becomes a low level and then is inputted to the NOR gate Nor1 of FIG. 1.

It will now be explained of an operation of the write pulse generation unit 100.

A) During a Write Operation

When the control signals bankt4 and casp6 are a high level, an output of a NAND gate G2 becomes a low level and an output of an inverter G3 becomes a high level. Therefore, as the NMOS transistor n1 is turned off, a transmission gate T0 is open, and the control signal write6 is a high level, the output write6dd of an inverter G4 becomes a low level. After then, when the control signal casp6 falls down to a low level, the output of the NAND gate G2 becomes a high level, which leads to close the transmission gate T0 and to turn on the NMOS transistor n1. As a result, the output write6dd of the inverter G4 becomes a high level and thus the control signal write6dd becomes a low pulse only generated during the write operation of the corresponding bank.

B) During a Read Operation

As the control signals bankt4 and casp6 are a high level and the control signal write6 is a low level, the output of the NAND gate G2 becomes a low level and the output of the inverter G3 becomes a high level. Therefore, the NMOS transistor n1 is turned off and the transmission gate T0 is open, and thus the output write6dd of the inverter G4 becomes a high level. After then, when the control signal casp6 falls down to a low level, the output of the NAND gate G2 becomes a high level, which leads to close the transmission gate T0 and to turn on the NMOS transistor n1. As a result, the output write6dd of the inverter G4 becomes a high level. The control signal write6 is a low pulse only generated during the write operation.

It will be explained of an operation of the isolation control signal generation unit 200 as follows.

After completing the power-up operation, the power-up signal pwrup maintains a low level so that an output node A of an inverter G12 always maintains a high level. Therefore, a NAND latch unit 300 is operated as two inputs NAND latch having the control signal write6dd and an output of the NAND gate nand3 as inputs. The two inputs normally maintain a high level. The control signal write6dd, as a first input of the NAND latch unit 300, as aforementioned, becomes a low level only at the moment the write command of the corresponding bank is inputted, and the output of the NAND gate nand3, as a second input, becomes a low level only at the moment the corresponding bank is precharged. Accordingly, the output bis_ctrl having the same level to the output of the NAND latch unit 300 becomes a high level when the write command is inputted, while becoming a low level when the bank is precharged.

It will be explained of an operation of the isolation control signal generation unit with reference to FIG. 5 as follows.

When the control signal wlst_bis falls down from a high level to a low level according to the precharge command, an output of an inverter G5 becomes a high level. As the control signal wlst_bis delayed passing through inverters G5, G6, G7 and G8 in the preceding state has been high state, an output BB of a NAND gate G9 fall down to a low level. Accordingly, an output of the NAND latch unit 300 becomes a low level, which results in that the output bis_ctrl of the NAND latch unit 300 passed through inverters G10 and G11 becomes a low level.

In order to describe the difference between the conventional art and a circuit constructed in accordance with an embodiment of the present invention, assuming that the operation of the exemplary circuit is divided into 1) a performance of a write operation of a specific bank, 2) an active of the corresponding bank, and 3) an operation inputting a read command of the corresponding bank, there should be an precharge operation of the corresponding bank between 1) and 2), to perform the operation 2).

It has been described the problem occurred when the write/read flag write6 is varied later than the sensing in the description of the problems in the conventional art. Furthermore, it will now be described about method of solving those problems of the conventional art.

Figure 5:
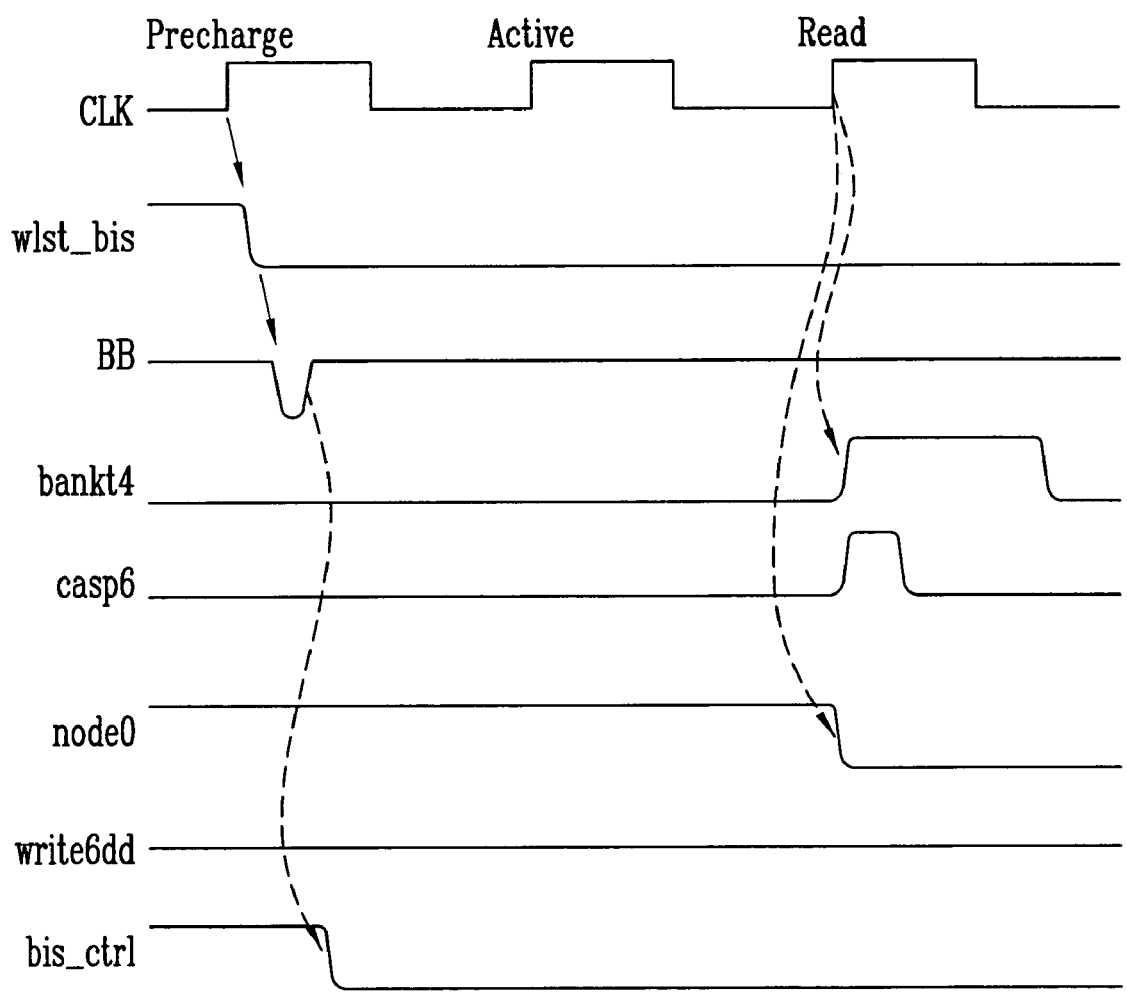
FIG. 5 is a waveform diagram illustrating an operation of the circuit in FIG. 4.
Figure 6:
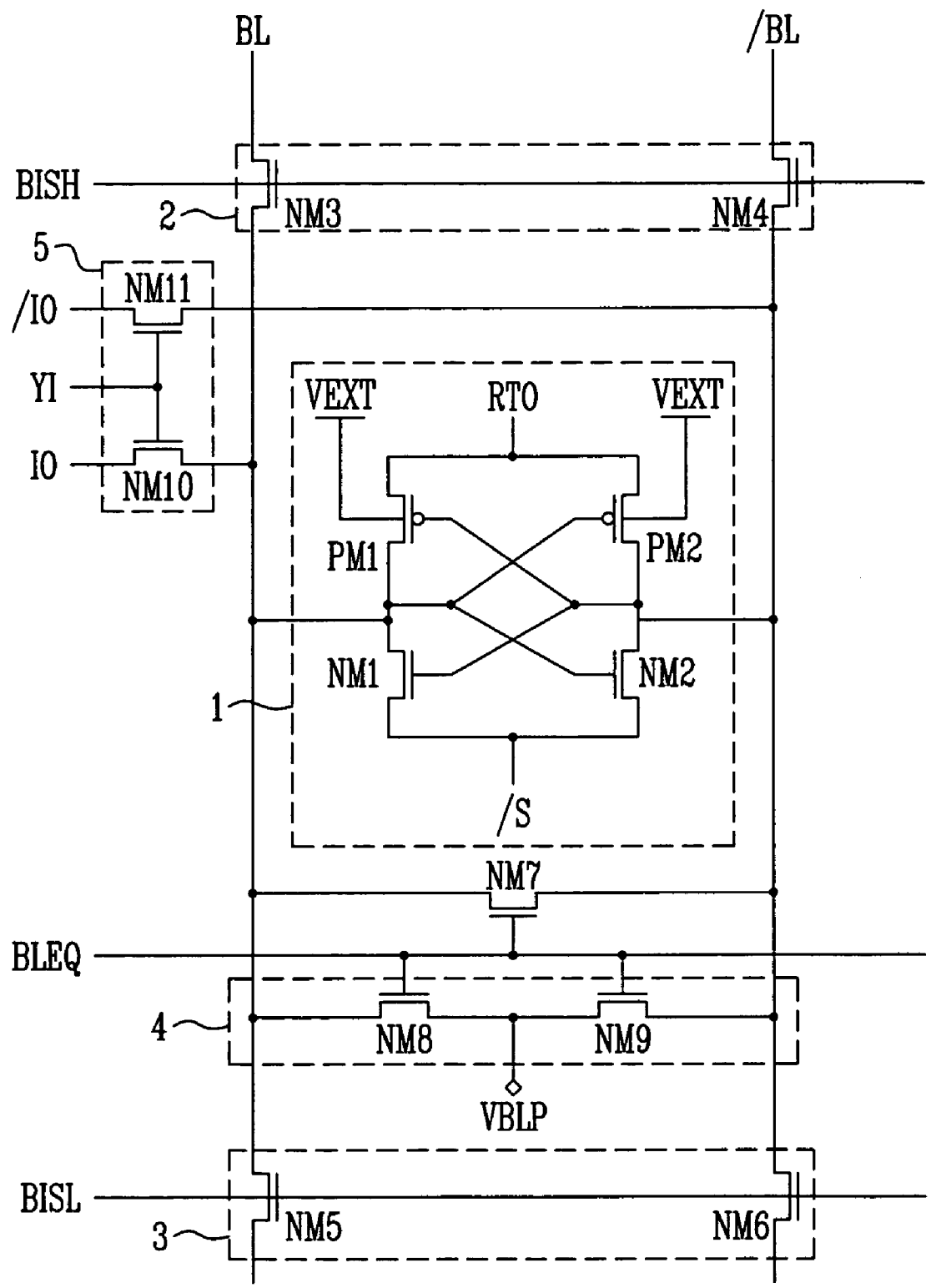
FIG. 6 is a circuit diagram illustrating a general sense amplifier.

In operations performed in order to write-precharge-active-read, the output bis_ctrl of the isolation control signal generation unit 200 has been a high level during the write operation, but becomes a low level during the precharge operation as shown in FIG. 5. Therefore, the output bis_ctrl has changed to a low level long enough before the read command is inputted.

In the conventional art, there has been a problem, caused when the timing that the output bis_ctrl has been a high level during the write operation and then becomes a low level during the read operation is later than the timing that the control signal sbe is enabled.

In a circuit or method in accordance with embodiments of the present invention, problems of the conventional art are solved by using the write/precharge flag instead of the write/read flag.

As aforementioned, in accordance with the present invention, the sensing margin and the speed of the bitline sense amplifier can be improved by efficiently isolating a connection between the bitline and the sense amplifier at the beginning of sensing according to the precharge command.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A bitline isolation driving circuit for generating an isolation signal to control an isolation circuit for isolating a connection between a bitline sense amplifier and a bitline at the beginning of sensing of a read operation, according to an output signal of a control unit generating an isolation control signal, a start signal of the bitline sense amplifier and a memory block select signal, wherein the control unit includes:
a write pulse generation unit for generating a first control signal according to a first input signal as a bank address signal latched for every clock, a second input signal generated when a write or a read command is inputted, and a third input signal varying level according to the read or the write command; and
an isolation control signal generation unit for generating the isolation control signal according to the first control signal, and a second control signal varying level according to a row active operation and a precharge operation.

2. The circuit of claim 1, wherein the second and third input signals don't include a bank information.

3. The circuit of claim 1, wherein the second control signal includes a bank information.

4. The circuit of claim 1, wherein the write pulse generation unit includes:
 a NAND gate for inputting the first and second input signals;
 a first inverter for inverting an output of the NAND gate;
 a transmission gate for transferring the third input signal to a first node according to the output of the NAND gate and an output of the inverter;
 a transistor connected between the first node and a ground and operating according to the output of the NAND gate; and
 a second inverter for generating the first control signal by inverting a potential of the first node.

5. The circuit of claim 1, wherein the isolation control signal generation unit includes:
 a first inverter for inverting the second control signal;
 a delay unit for delaying an output of the first inverter;
 a first NAND gate for having the output of the first inverter and an output of the delay unit as inputs; and
 a latch for outputting the isolation control signal by having the isolation control signal and an output of the first NAND gate as inputs.

6. The circuit of claim 5, wherein the isolation control signal generation unit further includes:
 a second inverter for inverting an output of the latch; and
 a third inverter for generating the isolation control signal by inverting an output of the second inverter.

7. The circuit of claim 5, wherein the isolation control signal generation unit further includes an inverter for enabling the latch by inverting a power-up signal.

8. The circuit of claim 5, wherein the delay unit is comprised of an odd number of inverters.

9. A bitline isolation driving circuit, comprising:
 a write pulse generation unit for outputting a high level signal during a write operation of a specific bank and outputting a low level signal during a read operation of a specific bank, by inputting write and read commands;
 an isolation control signal generation unit for generating an isolation control signal by having an output of the write pulse generation unit and a precharge command as inputs; and
 an isolation circuit for isolating a connection between the bitline sense amplifier and the bitline at the beginning of sensing of the read operation, according to the isolation control signal.

10. The circuit of claim 9, wherein the write command is a level signal not including a bank information, and the precharge command is a level signal including a bank information.

11. A write/precharge flag signal generation circuit, generating
 a write flag signal during a write operation according to a write command, and generating a precharge flag signal by changing the level of the output signal to the second level when a bank is precharged,
 wherein a level of the write flag signal is opposite to that of the precharge flag, and the write flag signal and the precharge flag signal is outputted through one terminal.

12. The circuit of claim 11, wherein the write/precharge flag signal generation circuit includes:
 a write pulse generation unit for outputting a first control signal of the first level during a write operation, and outputting the first control signal of the second level during a read operation by changing the level of the first control signal; and
 an isolation control signal generation unit for generating the write flag signal or the precharge flag signal according to the first control signal and a second control signal.

13. The circuit of claim 12, wherein a level of the second control signal is changed according to a row active operation and a precharge operation.

14. The circuit of claim 12, wherein the write pulse generation unit includes:
 a NAND gate for inputting first and second input signals;
 a first inverter for inverting an output of the NAND gate;
 a transmission gate for transferring a third input signal to a first node according to the output of the NAND gate and an output of the inverter;
 a switching unit coupled between the first node and a ground, and operating according to the output of the NAND gate; and
 a second inverter for generating the first control signal by inverting a potential of the first node.

15. The circuit of claim 14, wherein the first input signal includes a bank address signal latched for every clock, the second input signal is inputted to the NAND gate when a write or a read command is inputted, and a level of the third input signal is changed according to the write operation and the read operation.

16. The circuit of claim 12, wherein the isolation control signal generation unit includes:
 a first inverter for inverting the second control signal;
 a delay unit for delaying an output of the first inverter;
 a first NAND gate for logically combining output signals of the first inverter and the delay unit as inputs; and
 a latch for latching an output signal of the first NAND gate.

17. The circuit of claim 16, wherein the isolation control signal generation unit further includes:
 a second inverter for inverting an output signal of the latch; and
 a third inverter for inverting an output signal of the second inverter and then outputting the write flag signal or the precharge flag signall.

18. The circuit of claim 16, wherein the isolation control signal generation unit further includes an inverter for enabling the latch by inverting a power-up signal.

19. The circuit of claim 16, wherein the delay unit is comprised of an odd number of inverters.

* * * * *

UNITED STATES PATENT AND TRADEMARK OFFICE
CERTIFICATE OF CORRECTION

PATENT NO. : 7,054,210 B2  
APPLICATION NO. : 10/876158  
DATED : May 30, 2006  
INVENTOR(S) : Chang H. Lee Page 1 of 1

It is certified that error appears in the above-identified patent and that said Letters Patent is hereby corrected as shown below:

At Column 8, line 3, "is" should be -- are --.

At Column 8, line 50, "signall" should be -- signal --.

Signed and Sealed this

Ninth Day of January, 2007

JON W. DUDAS  
*Director of the United States Patent and Trademark Office*